United States Patent
Toutounchi et al.

(10) Patent No.: US 6,732,309 B1
(45) Date of Patent: May 4, 2004

(54) METHOD FOR TESTING FAULTS IN A PROGRAMMABLE LOGIC DEVICE

(75) Inventors: Shahin Toutounchi, Pleasanton, CA (US); Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 440 days.

(21) Appl. No.: 09/921,115

(22) Filed: Aug. 2, 2001

(51) Int. Cl.[7] ............................................... G01R 31/28
(52) U.S. Cl. ........................................ 714/725; 714/726
(58) Field of Search ................................ 714/724, 725, 714/726, 37; 326/37, 38, 41

(56) References Cited

U.S. PATENT DOCUMENTS

| | | | |
|---|---|---|---|
| 5,604,888 A | * 2/1997 | Kiani-Shabestari et al. |
| 5,623,501 A | * 4/1997 | Cooke et al. |
| 5,914,616 A | 6/1999 | Young et al. |
| 6,003,150 A | * 12/1999 | Stroud et al. |
| 6,202,182 B1 | * 3/2001 | Abramovici et al. |
| 6,484,280 B1 | * 11/2002 | Moberly |
| 6,574,761 B1 | * 6/2003 | Abramovici et al. |

* cited by examiner

*Primary Examiner*—Phung M. Chung
(74) *Attorney, Agent, or Firm*—H. C. Chan

(57) ABSTRACT

A new method to test short faults in a programmable logic device is described. The line segments under test are connected together to form a conducting chain. All the line segments neighboring to the conducting chain are tied to a known state. A test vector is applied to the programmable logic device. The state of the line under test is measured. If it is the same as the known state, the programmable logic device is likely to have faults.

5 Claims, 5 Drawing Sheets

METHOD FOR TESTING FAULTS IN A PROGRAMMABLE LOGIC DEVICE

FIELD OF THE INVENTION

This invention relates to testing of integrated circuits, and more specifically to a method for testing faults in programmable logic devices.

BACKGROUND OF THE INVENTION

Programmable logic devices exist as a well-known type of integrated circuit (IC) that may be programmed by a user to perform specified logic functions. There are different types of programmable logic devices, such as programmable logic arrays (PLAS) and complex programmable logic devices (CPLDs). One type of programmable logic devices, called the field programmable gate array (FPGA), is very popular because of a superior combination of capacity, flexibility and cost. A FPGA typically includes an array of configurable logic blocks (CLBS) surrounded by a ring of programmable input/output blocks (IOBs). The CLBs and IOBs are interconnected by programmable routing resources (such as single length, intermediate length and long interconnect lines) that are controlled by a plurality of programmable interconnection points (PIPs). The CLBs, IOBs, and the PIPs are typically programmed by loading a stream of configuration data (bitstream) into internal configuration memory cells that define how the CLBS, IOBS, and PIPs are configured. The configuration data is typically organized into frames. The configuration bitstream may be read from an external memory (e.g., an external PROM). The collective states of the individual memory cells then determine the function of the FPGA.

FPGAs are used by many users to implement a large number of circuits. These circuits can use any CLBs, IOBs, and interconnect lines in a FPGA. A product may malfunctions if any of these resources have defects. Thus, it is important to test a FPGA to make sure that all of these components are free of defects.

In IC technology, testing is an experiment in which an IC is exercised by applying a test vector to some of the inputs of the IC. The resulting response signals are analyzed to determine whether defects may be present in the IC. One way to test the interconnect lines is to turn on the appropriate PIPs to generate a chain of interconnect lines so that both ends of the chain are accessible externally. A test vector is then applied to the input end and the result measured at the output end. In order to test all the interconnect lines, a large number of chains need to be constructed and tested.

The chain is constructed by turning on appropriate PIPs. FIG. 1 shows an example of a chain 12 by turning on PIPs 16a–16d. A large number of similar chains need to be constructed, and associated PIPs turned on, in order to test all the interconnect lines.

Broadly speaking, there are two kinds of faults of interest: open fault and short fault. An open fault occurs when there is one or more unintended discontinuity on an interconnect line (or a series of connected interconnect lines). Chain 12 of interconnect lines is often used to test open faults. The connection of chain 12 is controlled by a plurality of PIPs, such as PIPs 16a–16d. Each PIP is controlled by a configuration memory (such as memories 14a–14d). When all the memories are at an ON state, chain 12 becomes conductive if there is no unintended discontinuity. However, if there is an open fault at an unintended point along chain 12, this chain becomes non-conducting. The open fault in chain 12 can be detected by sending a signal at a first end of chain 12, and determining whether the signal is detected at a second end. If chain 12 has an open fault, the signal would not pass from the first end to the second end.

In FIG. 1, the set of PIPs that are in the ON state, thus used in construction chain 12, are called the "used set." In conventional testing, a large number of configurations, each having a different used set, is loaded into a FPGA and then tested. All the PIPs in the used set in each configuration are turned on, and the open faults, if any, are detected by the above-mentioned measurement.

It is more difficult to measure short faults. A short fault occurs when two unconnected lines are shorted (i.e., connected) in one or more unintended places. The unintended connection that gives rise to the short fault may pass through a large area of a programmable logic device. When a signal is sent to one of the two unconnected lines, the signal may undergoes a large number of transformations when it reach the other unconnected line. As a result, it is more difficult to detect short faults.

One method to measure short fault is the so called "IDDQ" ($V_{DD}$ supply current quiescent) method. This method relies on the fact that when a complementary CMOS logic gate is not switching, it draws no DC current (except for leakage). When a fault occurs, for some combination of input conditions a measurable DC current, Idd, will flow. Testing consists of applying appropriate test signals, allowing the signals to settle, and then measuring the Idd. However, the combination of line pairs to be tested and short faults that may be activated in a large sized FPGA is enormous. Thus, the IDDQ method for detecting short faults is not reliable or practical.

What is needed is a simple yet reliable method for testing short faults.

SUMMARY OF THE INVENTION

The present invention involves a new method to test faults in programmable logic devices. Line segments under test in the programmable logic device are connected together to form one or more chains. These line segments are called the "used lines." Line segments in the device that are not associated with one of these chains are called "unused lines." A PIP that is incident with a used line at one end and incident with an unused line at another end is called a "neighbor" PIP. An unused interconnect line segment attached to a neighbor PIP is called a "neighbor line." In the present invention all the neighbor lines should be tied to a known state. A test vector is applied to the programmable logic device. The state of the line under test is measured. If it is different from the known state, short fault is not likely to occur.

This method is especially efficient in finding short faults in a FPGA. This is because the majority of resources in a FPGA is normally not used. As a result, a large number of resources can be tested at the same time.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to testing of programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

A brief description of an exemplary structure of FPGA is provided below and in FIG. 2 for better understanding of the present invention. The following drawing conventions are used in FIG. 2. A small solid black dot at the intersection of two lines indicates a permanent electrical connection between the crossing lines. An open circle enclosing an intersection between two lines, or separating a single line into two line segments, indicates a programmable bidirectional connection between the lines or line segments (for example, a pass transistor which is turned on to make the connection). An open triangle at an intersection of two lines indicates a programmable connection with signal flow going onto the line pointed to by the apex of the triangle. (The signal is of course then present on the full length of the line. Thus, a triangle pointing in the opposite direction would have the same signal flow because the triangle points to the same line.) A triangle showing a connection between two buses indicates that at least one connection exists between the lines making up the buses. In accordance with one embodiment of the present invention, programmable connections are provided by using programmable interconnection points (PIPs), wherein each PIP includes at least one transistor.

A line which ends within a tile or block structure (i.e., does not extend to the border of a tile or block) is physically terminated within the tile or block. A line which extends to the border of the tile connects to a line on the next tile, which it contacts when two tiles are abutted together. Note that some lines which extend to an edge of a tile and thus into an adjacent tile change names at the tile boundary.

Figure 1:
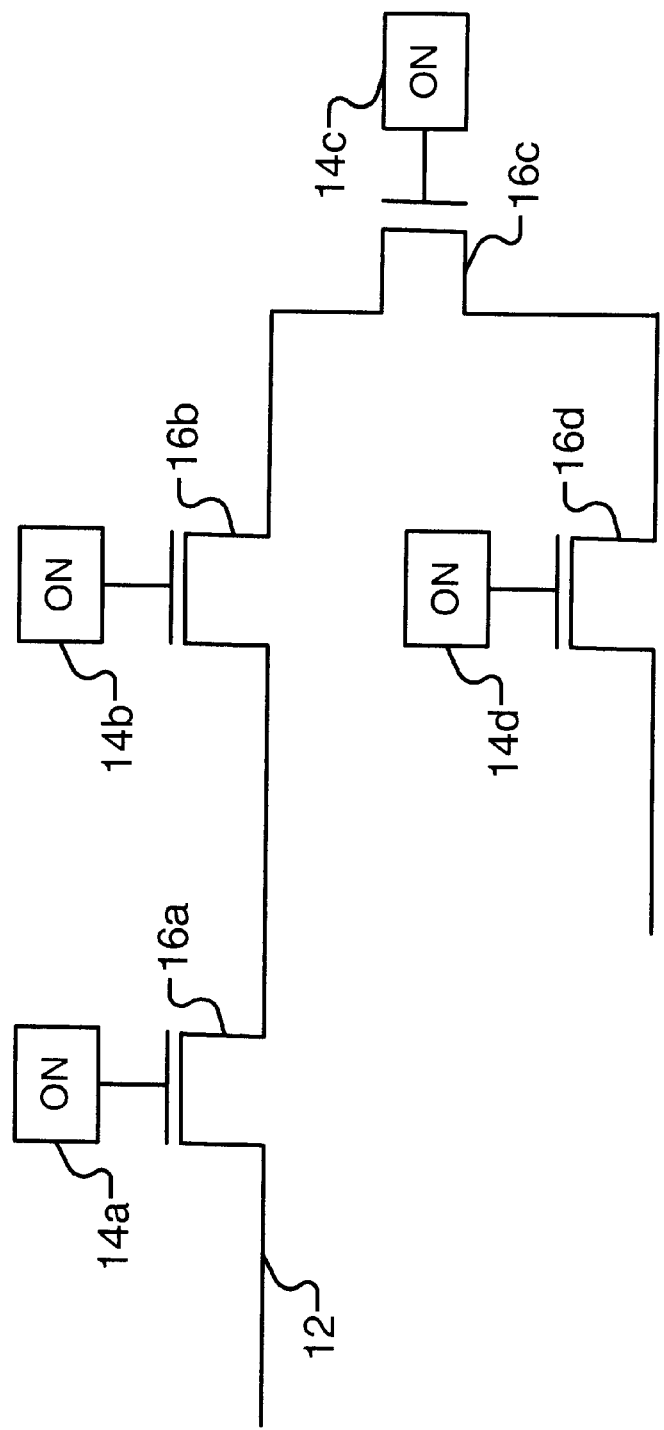
FIG. 1 shows a chain of interconnect lines used to measure open fault under conventional methods.
Figure 2:
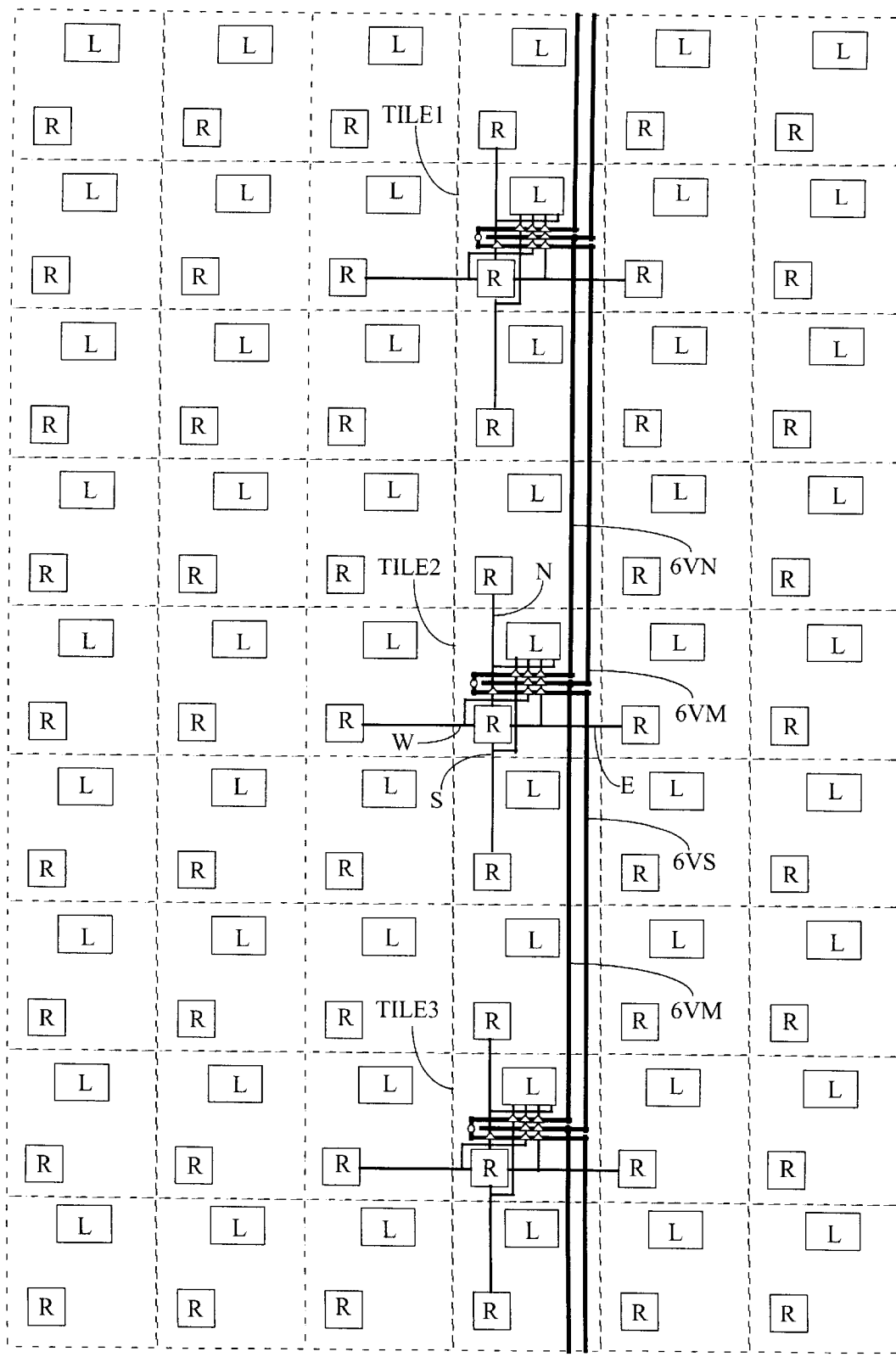
FIG. 2 shows an exemplary interconnect architecture of a FPGA that can be used for the present invention.

FIG. 2 shows in simplified form some of the single-length and intermediate-length interconnect lines according to one embodiment of the invention. Global interconnect lines (not shown) may also be present to carry global signals (such as clock signals). FIG. 2 illustrates part of an array of tiles in an FPGA. In each tile is logic block L and a routing or switching structure R. Also in each tile are line segments which connect to line segments in adjacent tiles to form interconnect lines. Most of the interconnect lines in the FPGA are not shown in FIG. 2 so as not to obscure the connectivity of the invention. Three of the tiles, labeled TILE1, TILE2, and TILE3 are shown in more detail, and short-and intermediate-length interconnect lines extending from TILE1, TILE2, alineILE3 are shown. (However, intermediate-length lines extending horizontally are not shown.) Single-length lines N, S, E, and W extend north, south, east, and west, respectively, from TILE2 to the four neighboring tiles. Equivalent lines not labeled extend from TILE1 and TILE3 as well. Identical structures are also present in all other tiles but are not shown in FIG. 2. These single-length lines N, S, E, and W extend between switching structures R in neighboring tiles; and have programmable connections to logic block L.

Intermediate-length lines also extend north, south, east and west from each tile to connect to other tiles three and six tiles away. Therefore in this embodiment the intermediate-length lines are "hex lines" as previously defined. Only the vertically extending (north and south) hex lines are shown, to avoid obscuring the connections. (Later figures show the complete connection pattern.)

From TILE2, hex line 6VN extends to the north a length of six tiles, connecting to TILE1 three tiles to the north and to another tile (not shown) six tiles to the north. Also from TILE2, hex line 6VS extends to the south six tiles, connecting to TILE3 and to another tile (not shown) six tiles to the south. Hex line 6VM connects tile TILE2 to tiles TILE1 and TILE3. Thus, three hex lines extend vertically and connect to TILE2. Also in TILE2, line 6vS is programmably connectable to line 6VN, as indicated by the PIP joining the ends of these two lines. In this manner an easy connection is available to a tile twelve tiles away from the starting tile. Only one additional connection is needed to extend the connection to another interconnect line six tiles long.

Note that within TILE2, only the single-length lines N, S, E, and W have access to logic block L. Thus a signal on a hex line must transfer to a single-length line to access logic block L in the destination tile. A signal entering TILE2 on line 6VS can connect to lines W, N, or E and thereby to logic block L in TILE2. Further, the signal now on single-length lines W, N or E can also access the logic block L in the tiles to the west, north or east of TILE2. In this embodiment, no connection from hex line 6vS to single-length line S is provided, as eliminating this connection saves silicon area and the tile to the south of TILE2 can be accessed through another path. In the embodiment of FIG. 2, a signal in TILE3 can reach the logic block of the tile to the south of TILE2 either by: 1) traversing two single-length lines to the north; or 2) taking hex line 6VM to TILE2, connecting to single-length line W or E, then entering switching structure R in TILE2 and "bouncing" (moving onto and off of an interconnect line in the same tile) from single-length line W or E to single-length line S inside the switching structure. The second alternative has one more PIP in the signal path than the first alternative, the PIP in switching structure R. In another embodiment, a connection to the south can of course be provided.

Additional details of the above-described interconnect structure can be find in U.S. Pat. No. 5,914,616 issued to Young, et al.

It can be seen from the above description of a typical FPGA that there are different types of interconnect lines, and that they can connected in complicated manners. When there are short faults between connection lines, the effect could be global (as opposed to open faults, where the effect is local to the lines connected by PIPs belonging to an used set).

Figure 3A:
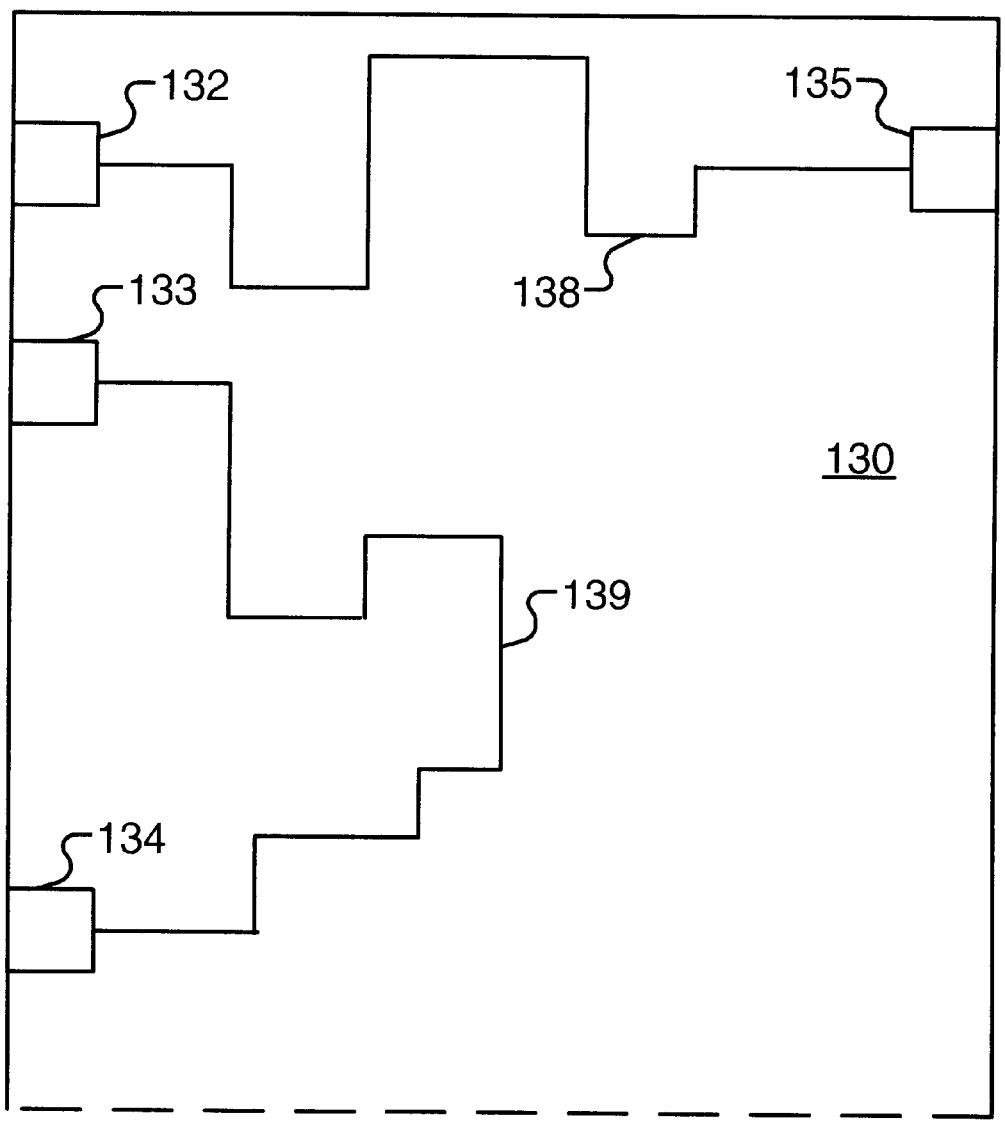
FIGS. 3A and 3B are a schematic diagram showing a portion of a programmable logic device containing a line under test in accordance with the present invention.

FIG. 3A is a schematic diagram showing a portion 130 of a programmable logic device containing a plurality of chains of connected line segments. Only two (labeled 138 and 139) are shown in FIG. 3A to simplify the discussion. Line 138 terminates at two IOBs 132 and 135. Line 139 terminates at two other IOBs 133 and 134. For each chain, a test signal can be applied to one IOB and the result observed at another IOB.

Figure 3B:
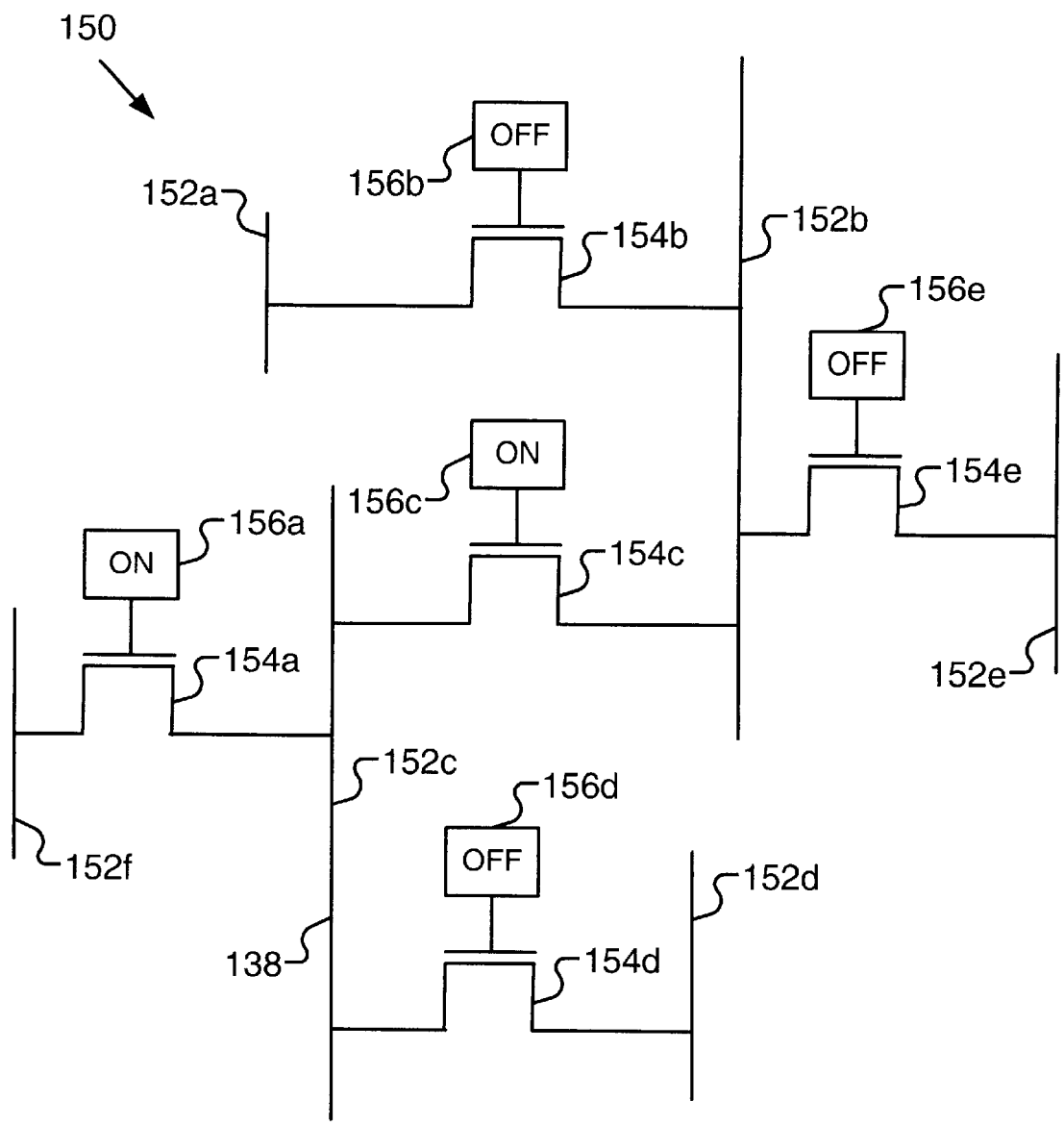

FIG. 3B is a schematic diagram showing a portion 150 of a programmable logic device surrounding a portion of one of the chains shown in FIG. 3A (e.g., chain 138). Portion 150 containing a plurality of interconnect lines 152a–152f and PIPs 154a–156d. These PIPs are controlled by memory cells 156a–156d. Some of the memory cells are in an ON state and some are in an OFF state. In FIG. 3B, memory cells 156a and 156c are turned ON, thus lines 152b, 152d and 152f are connected by PIPs 154a and 154c to form a part of a chain 138 of interconnect lines. Lines 152b, 152d, and 152f are called "used" lines. Memory cells 156b, 156d and 156e are turned OFF, thus PIPs 154b, 154d, and 154e are not used to form chain 138.

In the present invention, a PIP that is incident with a used line at one end and incident with an unused line at another end is called a "neighbor" PIP. The set of neighbor PIPs is called the "neighbor set." For example, PIP 154b is a neighbor PIP, assuming that interconnect line 152a is not used by any chain (such as chains 138 and 139). The unused interconnect lines attached to the neighbor set are called "neighbor lines." Under normal situations, the neighbor lines are not connected to the chain because all the PIPs in the neighbor set are set at an OFF state.

In the present invention all the neighbor lines should be tied to a known state. Note that the word "state" is typically used to describe a voltage level, within a predetermined tolerance value (e.g., 3.3 volts+/− 0.3 volt). In one embodiment, all the interconnect lines not used to form the chain (i.e., not just the neighbor lines) are tied to the known state.

It is found that short faults of a chain (e.g., chain 138) can be easily detected if all the neighbor lines are tied to a known state. This is because the chain will always be at the known state if there is short fault, regardless of the external signal applied to one end of the chain. In one embodiment, this known state is either ground ("tied down") or the supply voltage ("tied up"). In many integrated circuit implementations, tied down is preferred because many elements in a FPGA (e.g., PIPs and multiplexers) are implemented in NMOS instead of PMOS. It is known that NMOS drops one threshold voltage when passing "high" voltage, but passes "low" voltage unaltered.

One advantage of the test methodology of the present invention is that both the short and open faults can be tested in a single test.

Figure 4:
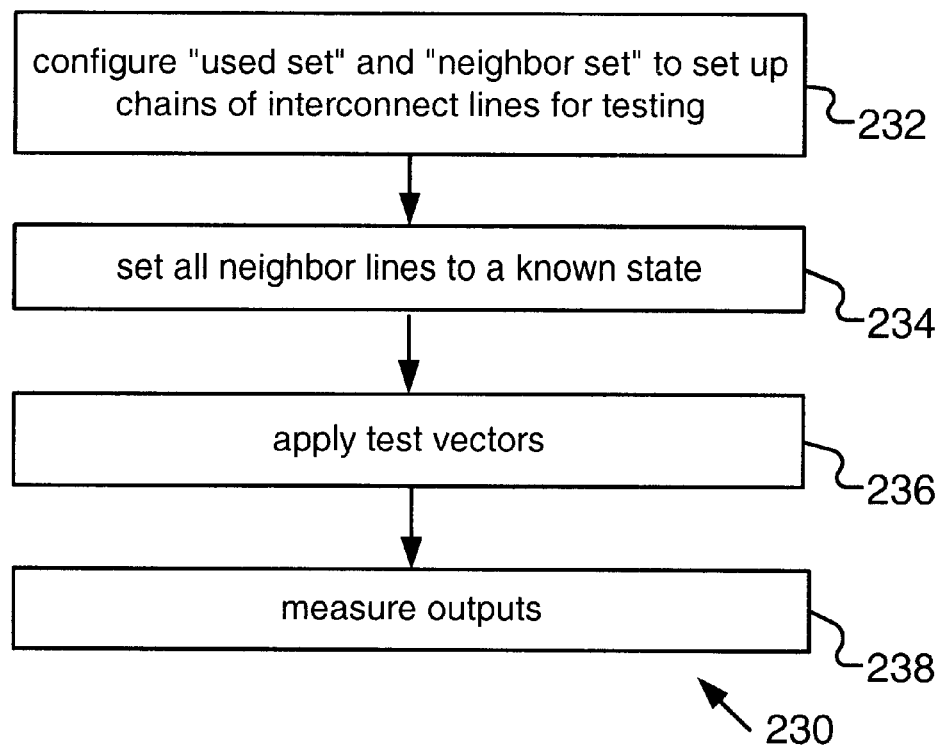
FIG. 4 is a flow chart showing the steps of the present invention to detect faults.

FIG. 4 is a flow chart 230 showing a method of testing faults in accordance with the present invention. In step 232, PIPs in the used set are turned to ON and in the neighbor set are turned OFF so as to set up at least one chain of interconnect line segments for testing. In step 234, all the neighbor lines are set to a known state (e.g., ground level). In step 236, test vectors are applied to one IOB connected to each chain. In step 238, the output at the other IOB is measured. If the output at the other IOB is at the same known state regardless of the input, the chain is likely to have a short fault. If the output is independent of the input, a open fault is likely to occur. The result of the test (either fault or no fault) can be communicated to a person performing the test.

In order to increase the confidence level of the test, it is desirable to drive the unused lines hard to the known state This will ensure that all the faults can be easily caught.

In a different embodiment of the present invention, some of the unused lines do not have to be tied down. For example, unused lines at a different metal layer from the lines under test may not need to be tied down. This is because lines at different metal level do not short easily.

It can be seen from the above description that a novel method for test faults has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

We claim:

1. A method for testing a programmable logic device, comprising the steps of:

connecting a first set of line segments in the programmable logic device to form at least one conducting chain;

identifying a set of programmable interconnect points that has only one end connected to the conducting chain;

setting a second set of line segments to a known state, each of the second set of line segments being connected to the set of programmable interconnect points and not belonging to the first set of line segments;

applying a test vector to one end of the conducting chain; and measuring an output at another end of the conducting line.

2. The method of claim 1 wherein the known state is at ground level.

3. The method of claim 1 wherein the known state is at a range of predetermined voltage levels.

4. The method of claim 1 further comprising the step of indicating the programmable logic device has a fault if the output is at the known state.

5. The method of claim 1 further comprising the step of indicating the programmable logic device has a fault if the output is independent of the test vector.

* * * * *